US012777837B2

(12) United States Patent
De Wolf et al.

(10) Patent No.: US 12,777,837 B2
(45) Date of Patent: Oct. 27, 2026

(54) TOP-TO-TOP CONNECTED THIN SOLAR MODULE AND METHOD

(71) Applicant: KING ABDULLAH UNIVERSITY OF SCIENCE AND TECHNOLOGY, Thuwal (SA)

(72) Inventors: Stefaan De Wolf, Thuwal (SA); Michele De Bastiani, Thuwal (SA); Anand Selvin Subbiah, Thuwal (SA); Furkan Halis Isikgor, Thuwal (SA); Erkan Aydin, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 376 days.

(21) Appl. No.: 18/265,994

(22) PCT Filed: Nov. 17, 2021

(86) PCT No.: PCT/IB2021/060655

§ 371 (c)(1),
(2) Date: Jun. 8, 2023

(87) PCT Pub. No.: WO2022/130062

PCT Pub. Date: Jun. 23, 2022

(65) Prior Publication Data

US 2024/0057361 A1 Feb. 15, 2024

Related U.S. Application Data

(60) Provisional application No. 63/150,743, filed on Feb. 18, 2021, provisional application No. 63/126,051, filed on Dec. 16, 2020.

(51) Int. Cl.

| | |
|---|---|
| ***H10K 85/50*** | (2023.01) |
| ***H10K 30/85*** | (2023.01) |
| ***H10K 39/12*** | (2026.01) |

(52) U.S. Cl.

CPC ............ *H10K 85/50* (2023.02); *H10K 30/85* (2023.02); *H10K 39/12* (2023.02)

(58) Field of Classification Search

CPC ......... H10K 85/50; H10K 30/85; H10K 39/12
See application file for complete search history.

(56) References Cited

U.S. PATENT DOCUMENTS 7,307,278 B2 * 12/2007 Liu ..................... H10K 10/466 257/40
2003/0140959 A1 * 7/2003 Gaudiana ............ H01G 9/2031 136/263

(Continued)

FOREIGN PATENT DOCUMENTS

KR 20130011598 A * 1/2013 ............ H10K 39/12
WO WO-2019070977 A1 * 4/2019 ............ H10K 85/50

OTHER PUBLICATIONS

English Machine Translation of KR 10-2013-001598A (Year: 2013).*

(Continued)

*Primary Examiner* — Kourtney R S Carlson
(74) *Attorney, Agent, or Firm* — PATENT PORTFOLIO BUILDERS PLLC

(57) ABSTRACT

A solar module for transforming solar energy into electrical energy includes a substrate and a pair of solar cells formed on the substrate next to each other and electrically connected in series to each other through a top common back electrode. A first solar cell of the pair has a pin configuration, and a second solar cell of the pair has a nip configuration. The pin configuration has hole and electron transport layers located in a reverse order relative to the nip configuration.

17 Claims, 12 Drawing Sheets

(56) References Cited

U.S. PATENT DOCUMENTS

| | | | | |
|---|---|---|---|---|
| 2006/0131566 | A1* | 6/2006 | Liu | H10K 10/466 257/40 |
| 2008/0295889 | A1 | 12/2008 | Schindler et al. | |
| 2018/0358571 | A1* | 12/2018 | Choi | H10F 77/244 |

OTHER PUBLICATIONS

Aslam, A., et al., "Dye-Sensitized Solar Cells (DSSCs) as a Potential Photovoltaic Technology for the Self-Powered Internet of Things (IoTs) Applications," Solar Energy, Jul. 18, 2020, vol. 207, pp. 874-892, Elsevier Ltd.

International Search Report in corresponding/related International Application No. PCT/IB2021/060655, date of mailing Mar. 1, 2022.

Written Opinion of the International Searching Authority in corresponding/related International Application No. PCT/IB2021/060655, date of mailing Mar. 1, 2022.

* cited by examiner

TOP-TO-TOP CONNECTED THIN SOLAR MODULE AND METHOD

CROSS-REFERENCE TO RELATED APPLICATIONS

This application is a U.S. National Stage Application of International Application No. PCT/IB2021/060655, filed on Nov. 17, 2021, which claims priority to U.S. Provisional Patent Application No. 63/126,051, filed on Dec. 16, 2020, entitled "TOP-TO-TOP CONNECTED PEROVSKITE THIN FILM SOLAR MODULE: DESIGN, FABRICATION, AND METHODS," and U.S. Provisional Patent Application No. 63/150,743, filed on Feb. 18, 2021, entitled "TOP-TO-TOP CONNECTED THIN SOLAR MODULE AND METHOD," the disclosures of which are incorporated herein by reference in their entirety.

BACKGROUND

Technical Field

Embodiments of the subject matter disclosed herein generally relate to a solar module and a method for making the solar module, and more particularly, to a thin-film solar module that has top-to-top connected perovskite solar cells.

Discussion of the Background

With the growing global concern for fossil fuels usage and sustainability, renewable energy is evolving rapidly worldwide. Electricity generation is vital to modern economies and life. Currently, power generation accounts for almost 50% of the global greenhouse gas emissions. Decarbonizing the power sector, while meeting the growing electricity demand, is a major challenge for decades to come. Solar power using photovoltaics plays a critical role in addressing the energy challenge and it is expected to become the world's largest source of electricity.

Photovoltaic modules based on thin-film photoactive materials are usually realized by interconnecting the divided smaller single solar cells in series, on a common substrate, to maintain the module's efficiency. The single cells are defined by scribing the layers that form the cell: the front electrode, the transport layers, the absorber material, and the bottom electrode. Generally, these layers are deposited sequentially over the whole area of the module, using deposition techniques that can be scaled easily. Making use of the scribing processes, one can define the active areas of the single cells, the interconnections, and the geometrical fill-factor of the modules. These scribing processes are often referred to as P1, P2, and P3, where P1 is the scribe that defines the front electrode, P2 scribe etches the active layer, and P3 scribe isolates the bottom electrode and the interconnection between the cells.

The general fabrication process of a thin-film solar cell module 100 is depicted in FIGS. 1A to 1H. The process includes seven steps, starting from the front electrode 104, which is coated on a substrate 102, as shown in FIG. 1A. Next, a front charge transport layer, TL, 106 is deposited on the front electrode 104 as shown in FIG. 1B, followed by the P1 scribing process shown in FIG. 10, i.e., etching through the front electrode 104 and the front charge transport layer 106 to define a via 108. The active layer 110, which is here implemented as a perovskite material, is deposited full-area on the patterned substrate as shown in FIG. 1D. Thus, the active layer 110 is formed inside the via 108 and over the front charge transport layer 106. Next, the P2 scribing is applied as shown in FIG. 1E to form another via 112 into the active layer 110, up to the front charge transport layer 106. Next, as shown in FIG. 1F, the back charge transport layer 114 and the back electrode 116 are deposited over the active layer 110, in this order, and into the via 112. The back electrode 116 is patterned as shown in FIG. 1G, by the P3 scribing, to form a third via 118, which completes the solar module 100, as shown in FIG. 1H. Note that the third via 118 extends only through the back electrode 116, up to the back charge transport layer 114.

In this embodiment, the substrate 102 may be made of glass, the front electrode 104 may be made of a transparent conducting oxide, the front charge transport layer 106 may be made of CuSCN (i.e., a hole transport material), the active layer 110 may include any perovskite, the back charge transport layer may be made of SnO2 (i.e., an electron transport material), and the back electrode 116 may be made of a metal. In this architecture, the front and back charge transport layers are interchangeable. The charge transport layers include but are not limited to, semiconductors such as inorganic semiconductors, metal oxides, metal sulfides, organic semiconductors, polymers, and any electron or hole transport layers know in art.

The final module 100 having plural cells 120-I is illustrated in FIG. 2 and has a first electrical contact 130 connected to the front electrode 104 of the first cell 120-1, and a second electrical contact 132 connected to the back electrode 116 of the last cell 120-I. Note that the cells 120-I of a given module 100 are connected in series to each other, as symbolically illustrated by the arrows, which indicate the flow of the electrical current among the cells. However, the module 100 has been found to suffer from various problems, one of which is the formation of a challenging recombination junction between the front and back charge transport layers.

Thus, there is a need for a new design of the solar cell module that is capable of converting solar energy into electrical energy at the same percentage or higher as the traditional modules while avoiding the formation of the recombination junction between the front and back charge transport layers.

BRIEF SUMMARY OF THE INVENTION

According to an embodiment, there is a solar module for transforming solar energy into electrical energy, and the solar module includes a substrate and a pair of solar cells formed on the substrate next to each other and electrically connected in series to each other through a top common back electrode. A first solar cell of the pair has a pin configuration, and a second solar cell of the pair has a nip configuration. The pin configuration has hole and electron transport layers located in a reverse order relative to the nip configuration.

According to another embodiment, there is a solar module for transforming solar energy into electrical energy, and the solar module includes a substrate and plural pairs of solar cells formed on the substrate next to each other, each pair of solar cells being electrically connected in series to each other through a top common back electrode, and solar cells from two adjacent pairs being electrically connected in series to each other through a bottom common front electrode. Each pair of solar cells has one solar cell with a pin configuration and another cell with a nip configuration. The pin configuration has hole and electron transport layers located in a reverse order relative to the nip configuration.

According to yet another embodiment, there is a method for making a solar module for transforming solar energy into electrical energy. The method includes simultaneously forming a first solar cell and a second solar cell on a substrate, next to each other, and electrically connecting in series the first solar cell to the second solar cell through a top common back electrode. The first solar cell has a pin configuration, and the second solar cell has a nip configuration. The pin configuration has hole and electron transport layers located in a reverse order relative to the nip configuration.

BRIEF DESCRIPTION OF THE DRAWINGS

For a more complete understanding of the present invention, reference is now made to the following descriptions taken in conjunction with the accompanying drawings, in which.

DETAILED DESCRIPTION OF THE INVENTION

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to plural solar cells connected in series to form a module. However, the embodiments to be discussed next are not limited to solar cells, but may be applied to other semiconductor devices that use transport layers that sandwich a perovskite active material or other semiconductor absorber materials including, but not limited to, organic semiconductors and thin-film inorganic semiconductors.

Reference throughout the specification to “one embodiment” or “an embodiment” means that a particular feature, structure or characteristic described in connection with an embodiment is included in at least one embodiment of the subject matter disclosed. Thus, the appearance of the phrases “in one embodiment” or “in an embodiment” in various places throughout the specification is not necessarily referring to the same embodiment. Further, the particular features, structures or characteristics may be combined in any suitable manner in one or more embodiments.

According to an embodiment, a novel solar module that includes plural solar cells has the solar cells connected in a top-to-top manner instead of a top-to-bottom manner as the traditional devices do.

Figure 1A:
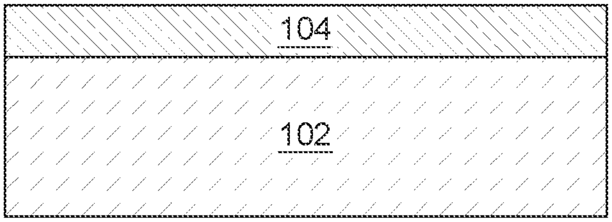
FIGS. 1A to 1H illustrate various stages of forming a solar module that includes plural solar cells electrically connected to each other in a top-to-bottom fashion.
Figure 1B:
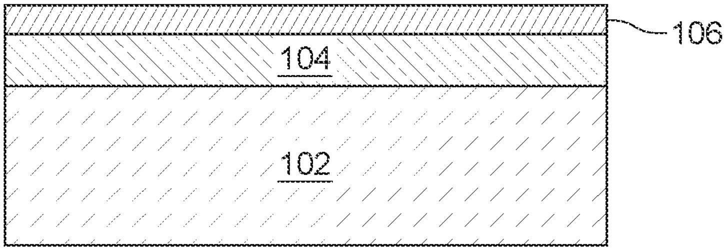
Figure 1C:
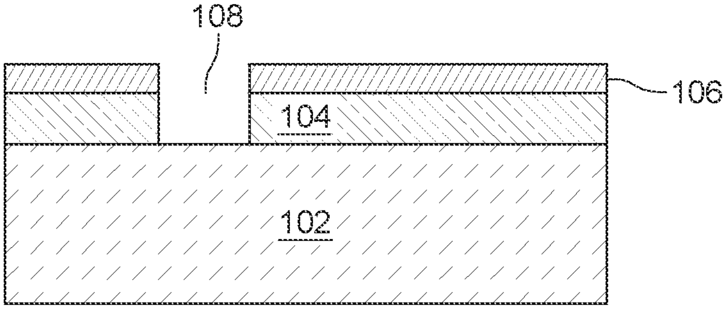
Figure 1D:
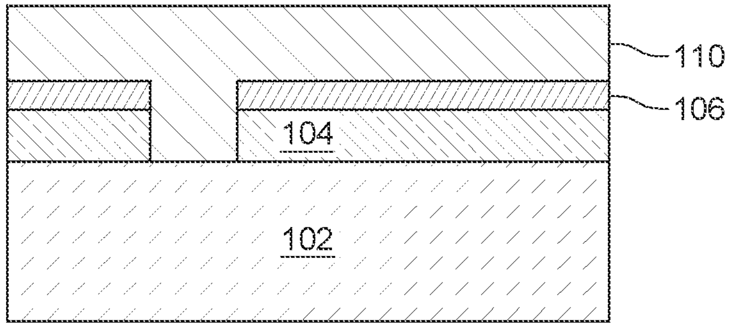
Figure 1E:
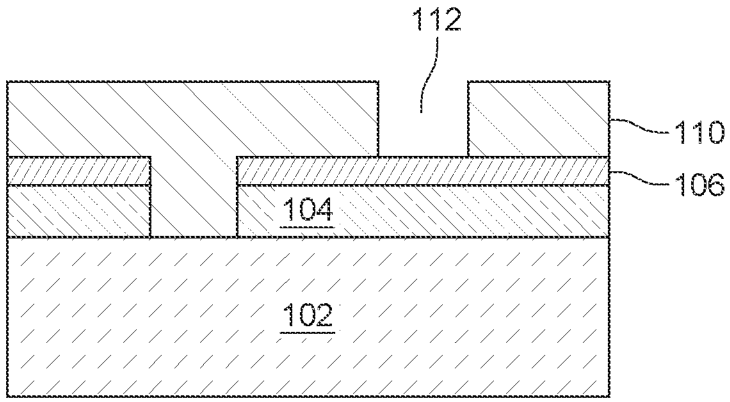
Figure 1F:
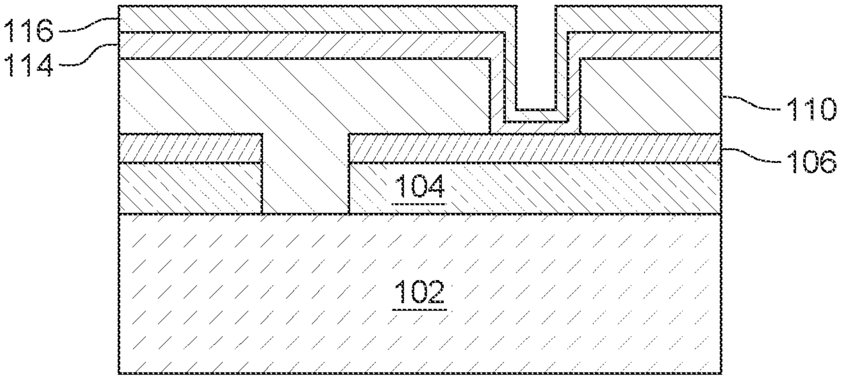
Figure 1G:
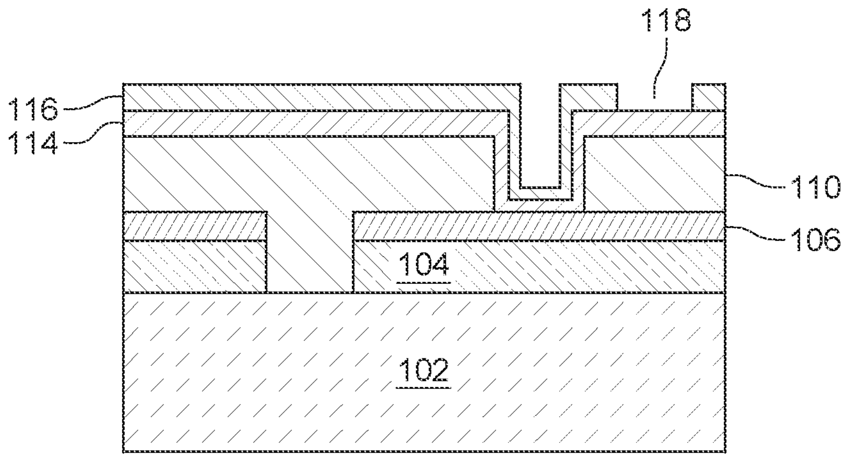
Figure 1H:
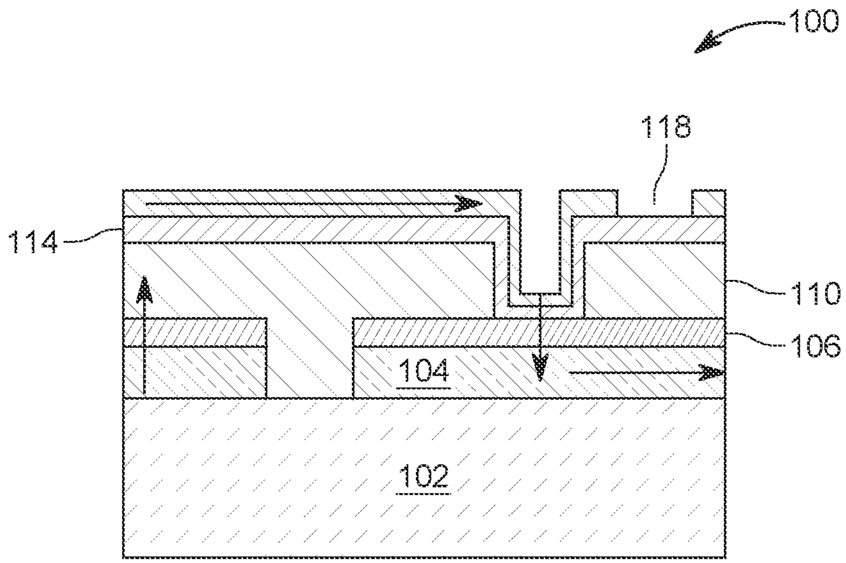
Figure 2:
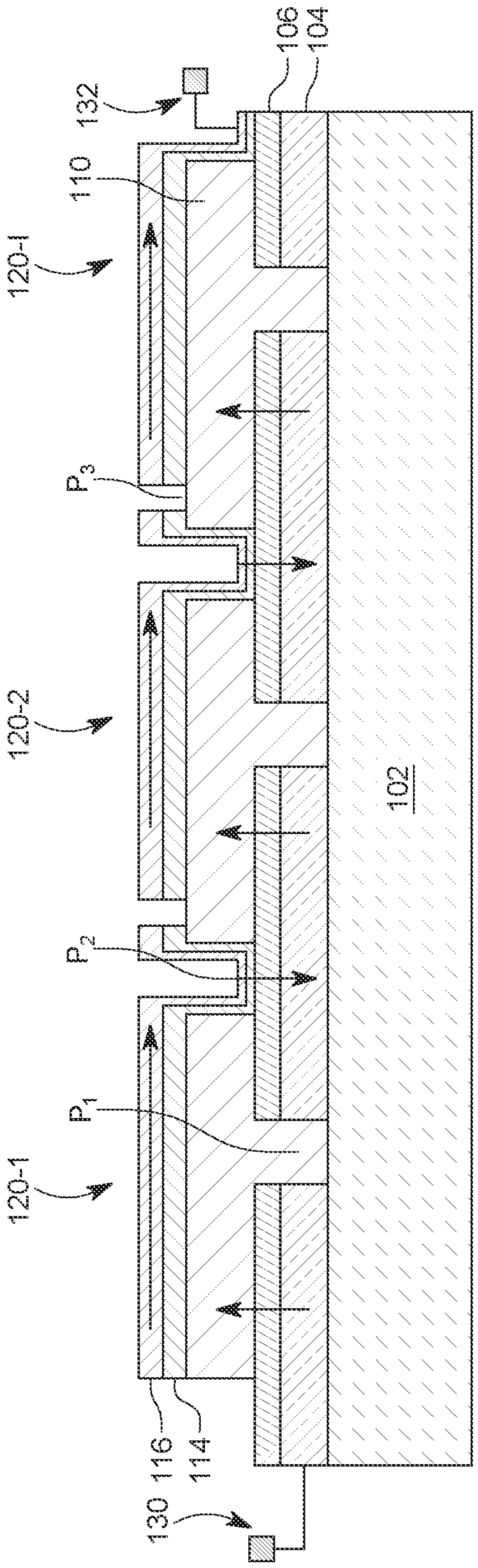
FIG. 2 illustrates a side view of the solar module noted above.
Figure 3:
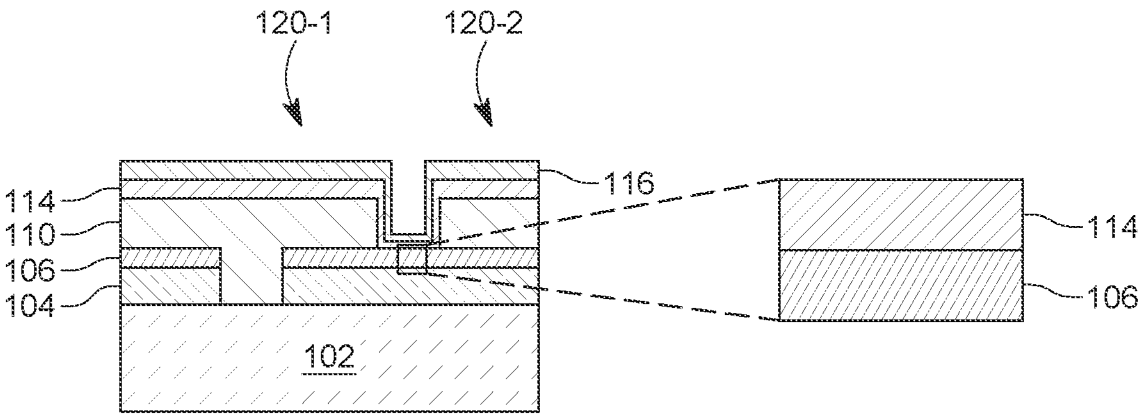
FIG. 3 illustrates a recombination junction that is present in a solar module that includes plural solar cells electrically connected to each other in a top-to-bottom fashion.

Despite the remarkable success with several industrial applications, the process illustrated in FIGS. 1A to 1H presents several complications, particularly if the perovskite material is employed as an active layer. Firstly, the P1, P2, P3 scribing processes require a high-level of sophistication. Due to the micrometer dimension of the scribe lines, the process can be achieved either using a laser or via a mechanical process. In both cases, the major complications are represented by the precision of the process, since excessive scribing can hamper the underlying layers. Secondly, scribing requires expensive tools that increase the production cost of the module. Thirdly, the module 100 is made of a number of single cells 120-I electrically connected in series, in a top-to-bottom manner, as illustrated in FIG. 2, and the top-to-bottom connection requires the formation of a recombination junction between the front and bottom transport layers 106 and 114, as illustrated in FIG. 3. The recombination junction is a physical region at the interface between the front charge transport layer 106 and the back charge transport layer 114, where the electrons from one cell 120-1 recombine with the holes from the adjacent cell 120-2. The recombination process needs to be balanced, or otherwise, an accumulation of one of the carriers may occur, negatively affecting the performance of the module (particularly with voltage losses). For this reason, the two transport layers need to be properly designed, which limits the choice of materials available.

Figure 4:
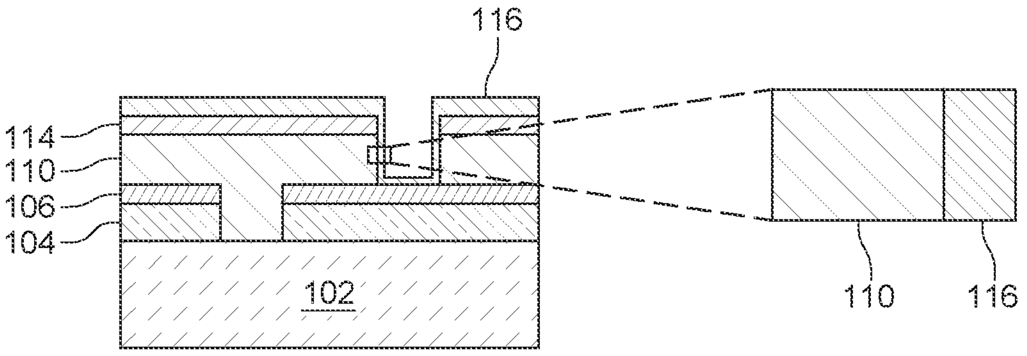
FIG. 4 illustrates a metal/perovskite interface that is present in a solar module that includes plural solar cells electrically connected to each other in a top-to-bottom fashion.

To avoid the recombination junction shown in FIG. 3, the back charge transport layer is often masked. In this way, the contact between the back and front electrodes is favored, as illustrated in FIG. 4. However, this design allows for a direct contact to be made between the back electrode 116 and the active layer 110. In a perovskite-based module, this is undesirable because the perovskite in contact with a metal (such as the back electrode), decomposes quickly, negatively affecting the stability of the entire module 100.

According to an embodiment, a new concept for the fabrication of thin-film modules (for example, using perovskite photo-absorber) is introduced, which eliminates the issues associated with the conventional processing described above with regard to FIGS. 3 and 4, because the new solar module prevents having at the same time, the metal/perovskite interface and the need of a recombination junction. Indeed, perovskite solar cells can be efficiently fabricated both in pin or nip configurations. In the pin configuration, the front charge transport layer collects holes (p), while the bottom transport layer collects electrons (n). In the nip configuration, the front charge transport layer collects electrons (n), while the bottom transport layer collects holes (p). The (i) stands for an intrinsic region that is sandwiched between the (n) and (p) regions.

According to this embodiment, when both pin and nip perovskite solar cells are brought together, they are configured as discussed next, to share the same back electrode, so that the two cells are connected in series. In this way, the metal contact is deposited only atop of the active area, via shadow masking, which avoids the formation of the perovskite/metal interface. Thanks to the alternating pin-nip configuration, electrons and holes recombine at the top metal contact (similarly to the single cell case), and for this reason this new configuration excludes the need of a recombination junction. By extending this approach to multiple cells, this embodiment discloses a new design to fabricate a thin-film perovskite module. In addition, the top-top approach reduces voltage building in comparison to top-bottom series connected cells for a given area (halves) and rather double the short circuit current.

Figure 5A:
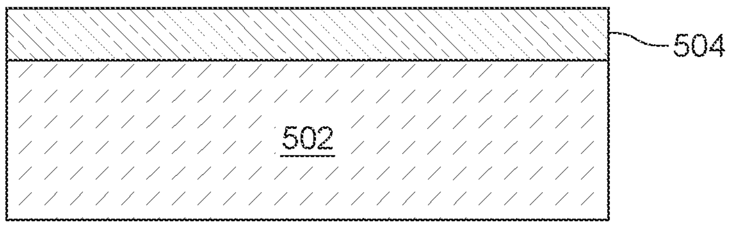
FIGS. 5A to 5G illustrate various stages of forming a solar module that includes plural solar cells electrically connected to each other in a top-to-top fashion.
Figure 5B:
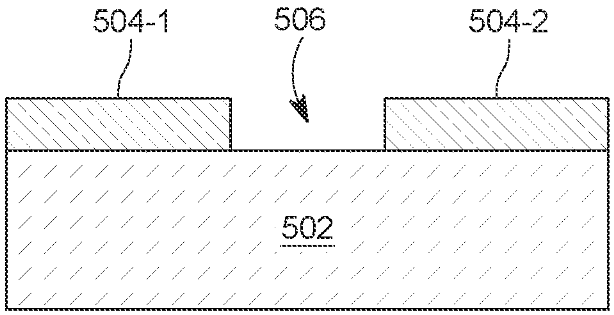
Figure 5C:
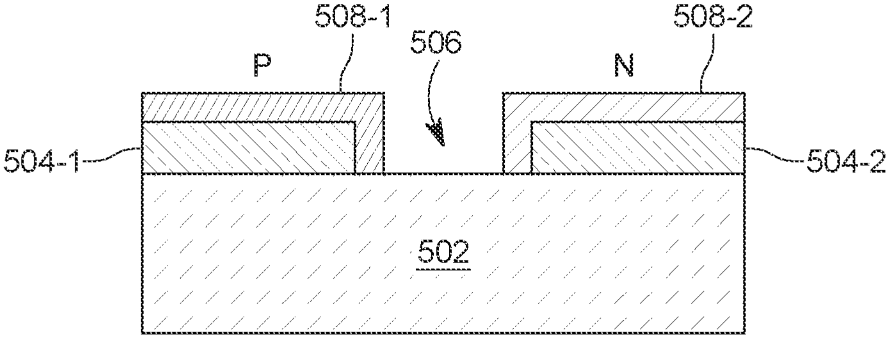

The fabrication steps of the new process are described with regard to FIGS. 5A to 5G. A front electrode 504 is formed initially on a substrate 502, as shown in FIG. 5A, by known methods. The front electrode may be made of a transparent conductive oxide. It is noted that the substrate 502 and the front electrode 504 extend in a given plane, so that many solar cells are formed in the given plane, as discussed later. FIGS. 5A to 5G show only the formation of two cells 520-1 and 520-2 on the common substrate 502 for simplicity. Any number of cells may be formed with this process on a common substrate. Next, a desired pattern is chemically etched into the front electrode 504, for forming desired openings or vias 506, as illustrated in FIG. 5B. This process results in plural front electrodes, for example, first and second front electrodes 504-1 and 504-2, that are physically separated from each other for the adjacent cells 520-1 and 520-2. However, as discussed later, other cells may share the same front electrode 504. The vias 506 extend through the front electrode 504 up to the substrate 502. On the patterned front electrodes 504-1 and 504-2, two different front charge transport layers 508-1 and 508-2 are deposited, one on each electrode, either via solution or vacuum depositions. These two layers are used to collect electrons and holes, respectively. In this embodiment, the front charge transport layer 508-1 collects holes and the front charge transport layer 508-2 collects electrons. It is noted that the first transport layer 508-1 is part of the first cell 520-1 and thus, it is deposited only on the front electrode 504-1 while the second transport layer 508-2 is part of the second cell 520-2, and thus, it is deposited only on the front electrode 504-2.

Figure 5D:
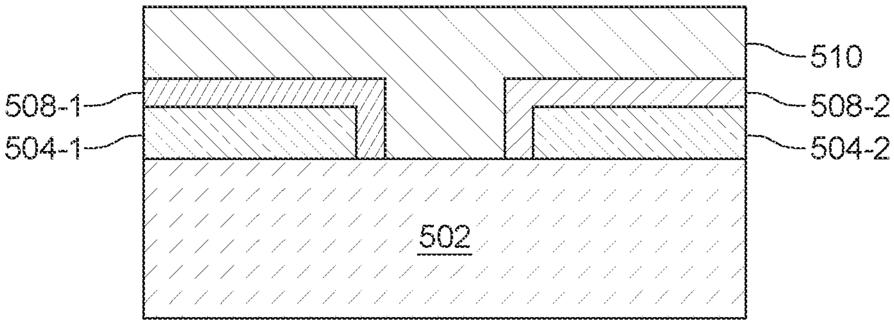
Figure 5E:
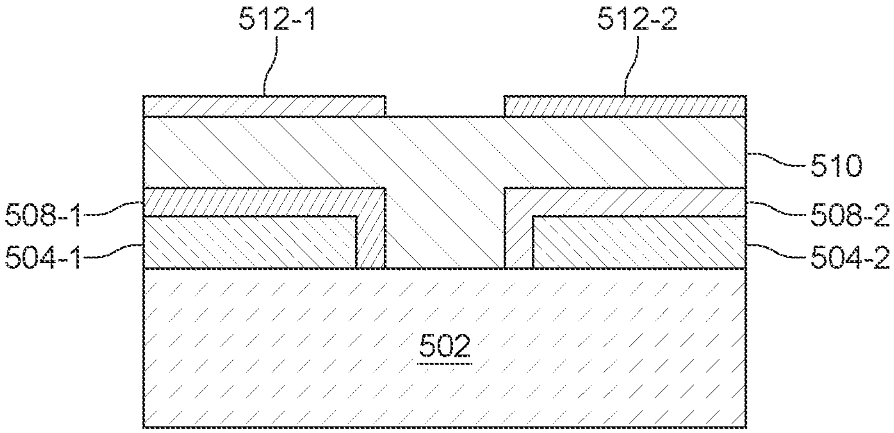
Figure 5F:
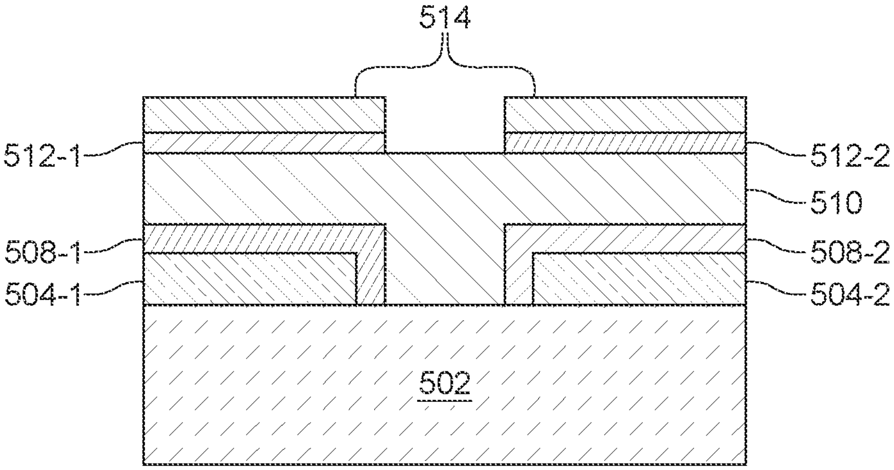

Next, an active layer 510, for example, a perovskite layer, is deposited over the entire first transport layer 508-1, via 506, and the second transport layer 508-2, as shown in FIG. 5D. Atop of the active layer 510, first and second back charge transport layers 512-1 and 512-2 with opposed polarity with respect to the first and second front charge transport layers 508-1 and 508-2, respectively, are deposited either via solution or vacuum depositions, as illustrated in FIG. 5E. Alternatively, the front and back charge transport layers may be formed by slot-die printing. Depending of the front charge transport layers, the back layers are used to collect holes or electrons, respectively. The last step in the formation of the cells 520-1 and 520-2 is the deposition of a back electrode 514, which covers both cells 520-1 and 520-2 to form the module 500. Note that if N cells are made with this process, the back electrode 514 covers all N cells, where N is a natural number equal to or larger than 2. The materials used to make each element of the module 500 may be identical to those used to make the module 100 illustrated in FIG. 1H, or any other known materials in the field, as long as the pair of the front charge transport layers have opposite polarities, and the front and back charge transport layers of a same cell have opposite polarities. Due to these particular features, the two adjacent cells 520-1 and 520-2 have an opposite structure, i.e., pin and nip or nip and pin, where the p region is the transport layer that collects holes, i.e., p-transport layer, the i region is the active layer, and the n region is transport layer that collects electrons, i.e., the n-transport layer. In one embodiment, any two adjacent cells that are directly connected to each other, from an electrical point of view, have opposite structures.

Figure 5G:
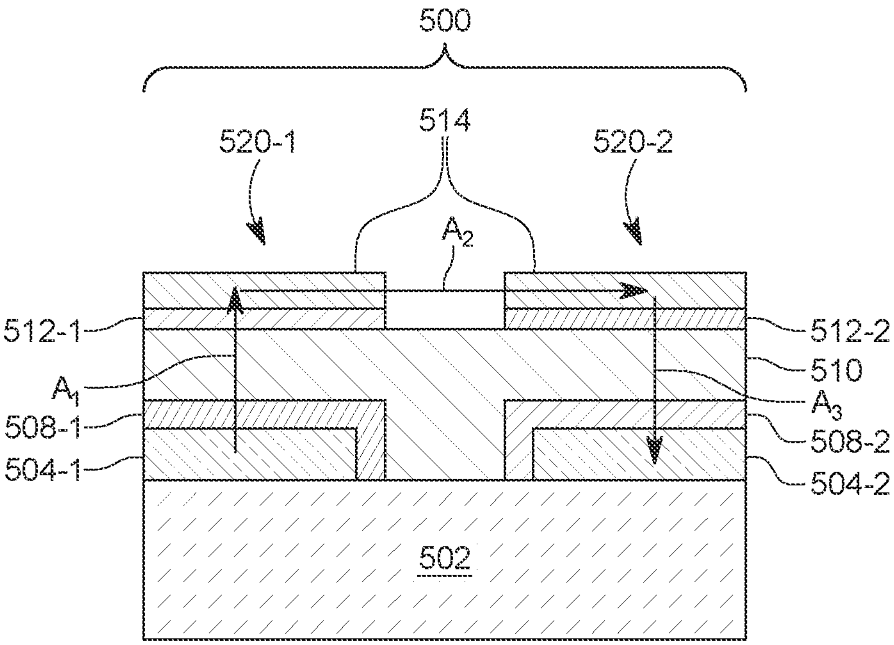

FIG. 5G shows the final module 500 in cross-section and also indicates the flow (see arrows in the figure) of the electrical current through the two cells 520-1 and 520-2 and also between the two cells. In this regard, it is noted that the current flows from the first front electrode 504-1 through the first front charge transport layer 508-1, the active layer 510, the first back charge transport layer 512-1 into the back electrode 514, as described by arrow A1. Then, the current flows along the common back electrode 514 to second cell 520-2, as described by arrow A2, after which it enters the second back charge transport layer 512-2. From here the current flows through the active material 510, the second front charge transport layer 508-2, and the second front electrode 504-2, as illustrated by arrow A3.

Figure 6A:
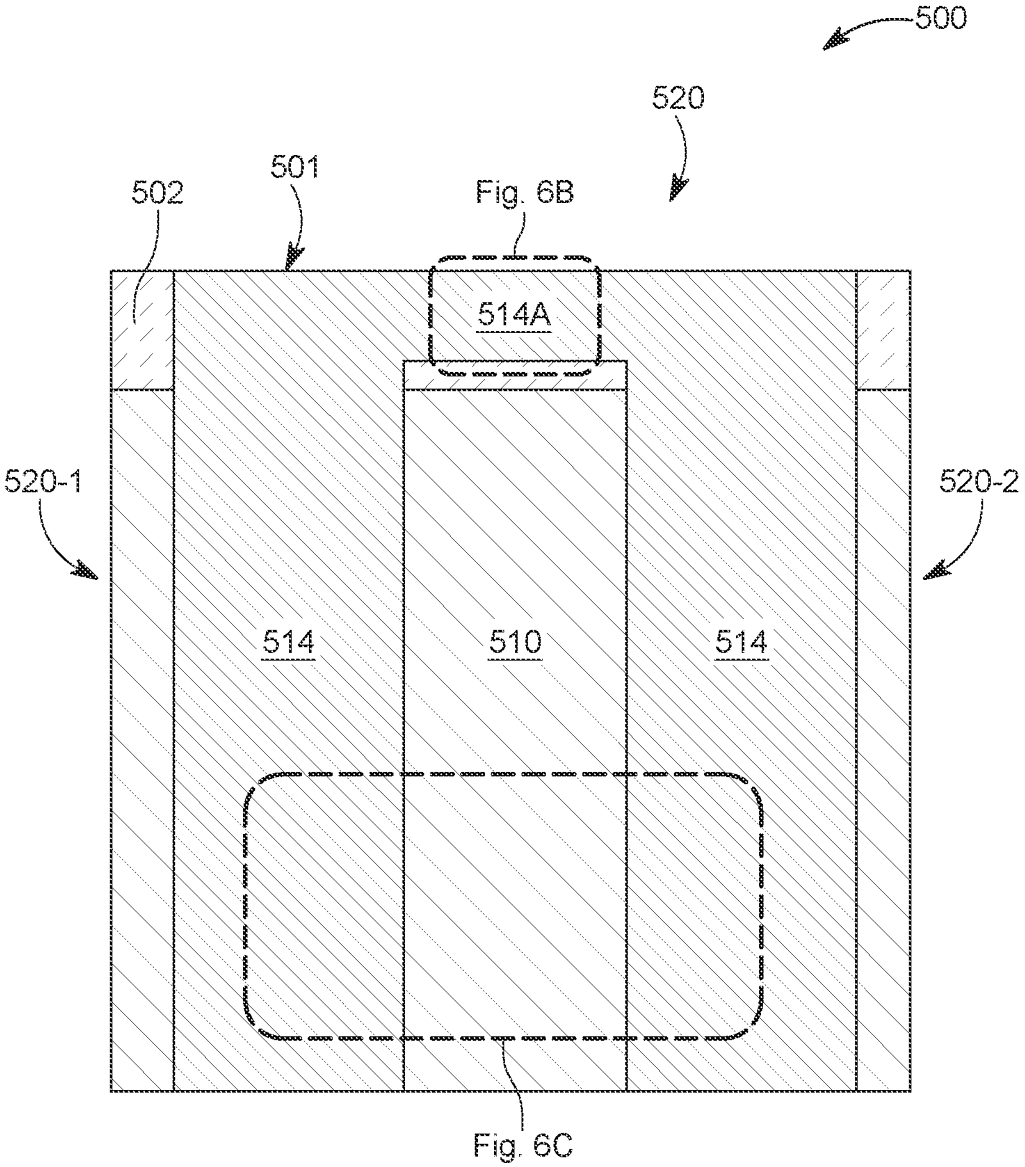
FIG. 6A is a top view of the solar module shown in FIGS. 5A to 5G.
Figure 6B:
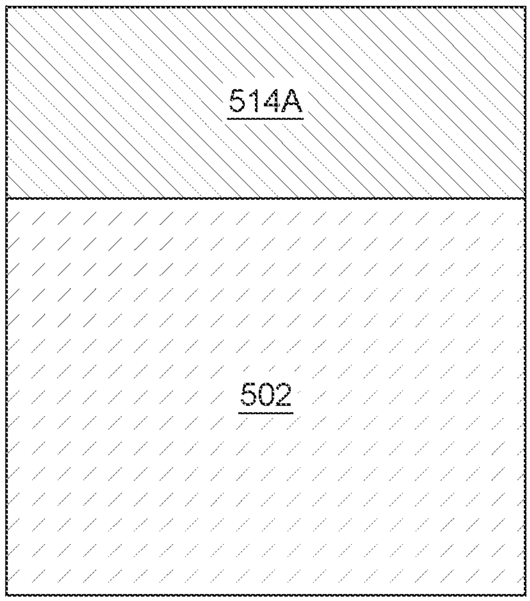
FIG. 6B is a side view of the same solar module.
Figure 6C:
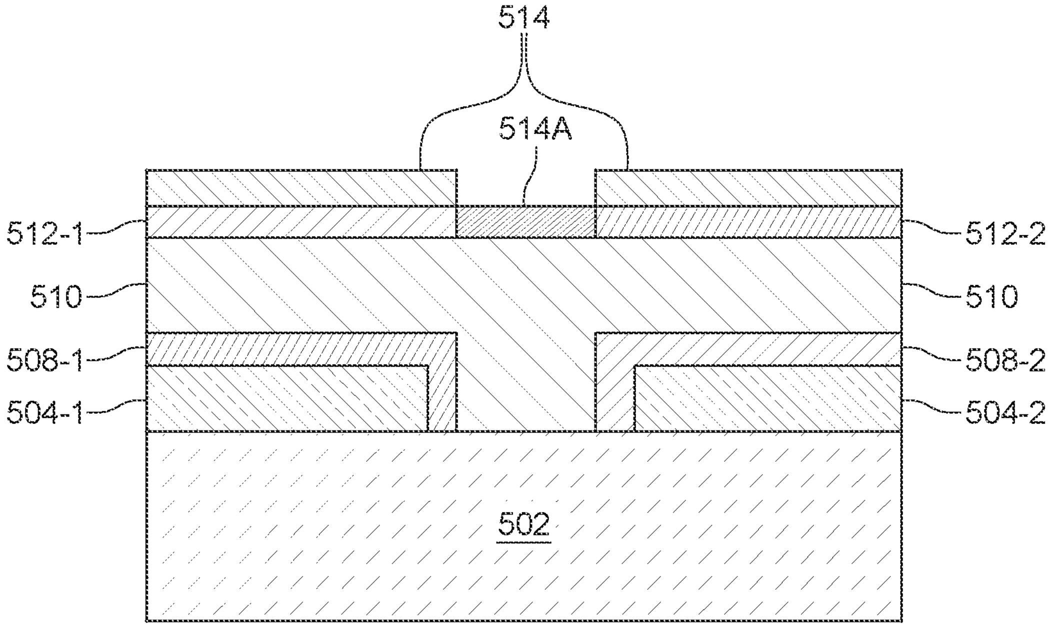
FIG. 6C is a cross-section view of the same solar module.

Although FIG. 5G appears to show that there is no electrical connection between the back electrodes 514 of the first and second cells 520-1 and 520-2, this is only so in the cross-sectional view shown in FIG. 5G. In fact, FIG. 6A shows a top view of a pair 520 of two cells 520-1 and 520-2, with the back electrode 514 extending over the substrate 502, past the transport layers and the active layer, so that for an edge 501 of the module 500, as shown in FIG. 6B, part 514A of the back electrode 514 is in direct contact to the substrate 502. FIG. 6C is a side view of the module 500, which is similar to FIG. 5G except that the side view also shows the part 514A of the back electrode 514 that is formed directly over the substrate 502.

Figure 7:
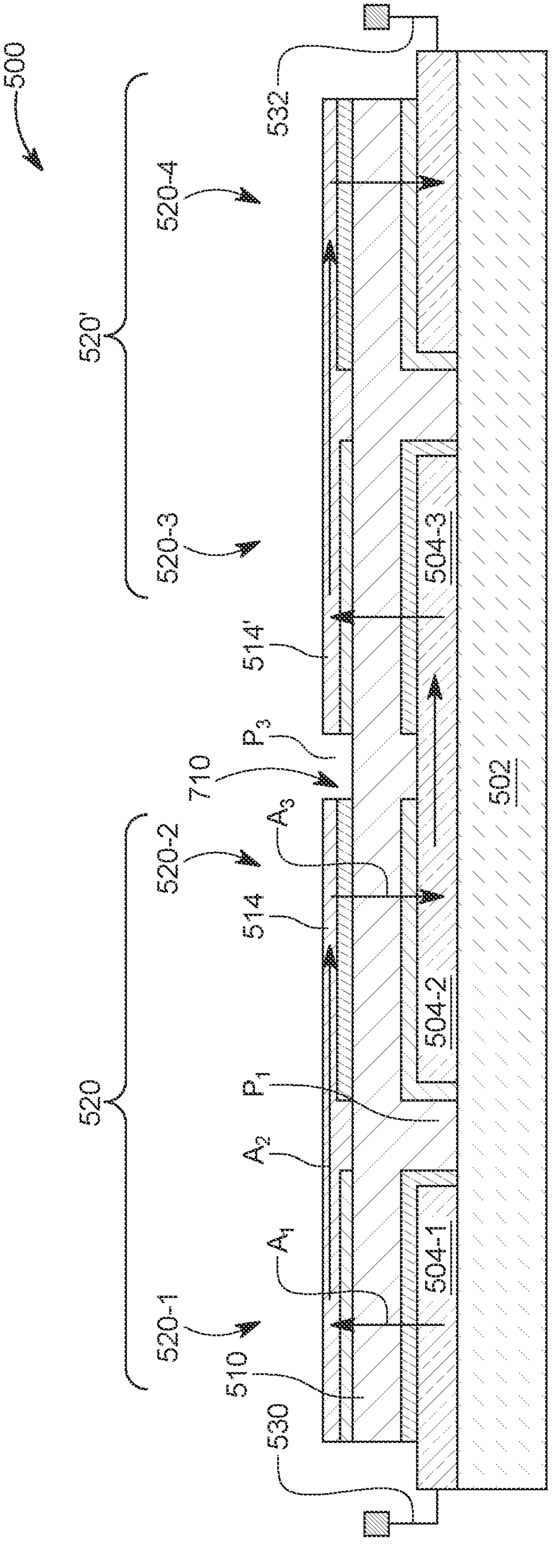
FIG. 7 is a side view of the solar module shown in FIGS. 5A to 5G that illustrates two different pairs of solar cells, each pair using a top-to-top electrical connection between its solar cells and the two pairs using a bottom-to-bottom electrical connection between them.

If the module 500 is desired to have more than two cells 520-1 and 520-2, then more pairs of such cells may be added, as illustrated in FIG. 7. In this regard, it is noted that because of the combination of a pin cell with a nip cell, pairs of such combination of cells need to be combined to form the module 500. FIG. 7 shows two pairs 520 and 520' of cells, having a total of four cells 520-1 to 520-4. Note that each of the two pairs 520 and 520' has the structure shown in FIGS. 5G to 6C. The electrical connection between the cell 520-2 of the first pair 520 and the cell 520-3 of the second pair 520' is achieved by the second front electrode 504-2 of the first pair being directly connected to the first front electrode 504-3 of the second pair. The third cell 520-3 is electrically connected in series to the fourth cell 520-4 through another top common back electrode 514', as shown in FIG. 7. Note that the two common back electrodes 514 and 514' are not physically connected to each other due to via 710 formed between the back charge transport layers.

With this novel design, the P1, P2, and P3 scribing processes are not required anymore. The P1 scribe can be substituted by the chemical etching, which can be obtained through a simple shadow mask. Also, the P2 process is completely eliminated since the perovskite layer is not patterned, and thanks to the micrometer diffusion-length of the charges, which is orders of magnitude inferior to the distance between the cells, the recombination event is avoided. Finally, the P3 can be substituted by simple masking of the deposition of the back electrode, preventing any contact between the perovskite and the metal, as shown in FIGS. 6A to 6C.

The module 500 discussed above finds application in the field of renewable energies, particularly solar cells, and more specifically in the production of thin-film perovskite solar modules. The perovskite material absorber can be replaced by any suitably organic absorbers and polymer absorbers as well. The module 500 may be built to have any number of pairs of nip and pin solar cells.

Figure 8:
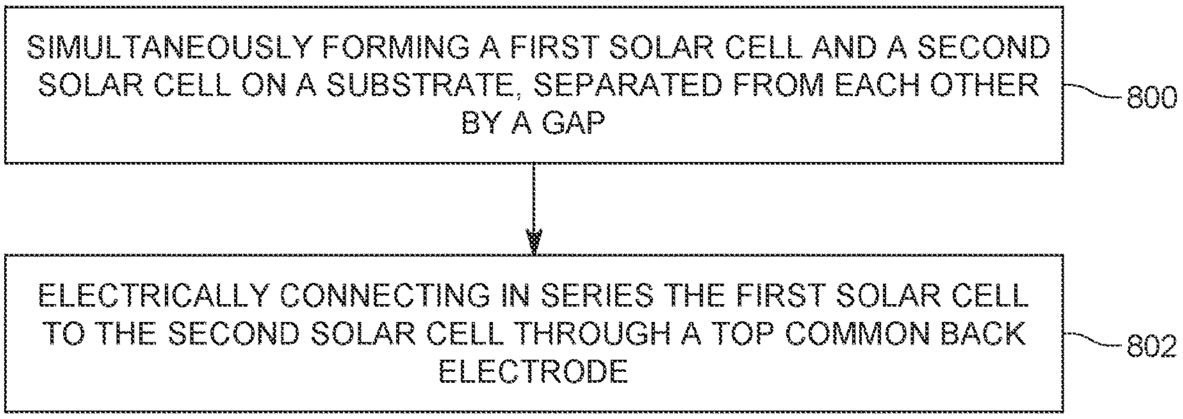
FIG. 8 is a flow chart of a method for manufacturing the solar module illustrated in FIG. 7.

A method manufacturing the module 500 is now discussed with regard to FIG. 8. The method includes a step 800 of simultaneously forming the first solar cell 520-1 and the second solar cell 520-2 on the substrate 502, next to each other, and a step 802 of electrically connecting in series the first solar cell 520-1 to the second solar cell 520-2 through a top common back electrode 514. The first solar cell 520-1 has a pin configuration, and the second solar cell 520-2 has a nip configuration, and the pin configuration has hole and electron transport layers located in a reverse order relative to the nip configuration.

The step of simultaneously forming the first and second solar cells includes forming the first front electrode 504-1 and forming the second front electrode 504-2 on the substrate so that the first and second front electrodes are separated by a gap, forming the first front charge transport layer 508-1 on the first front electrode and forming the second front charge transport layer 508-2 on the second front electrode, forming the active layer 510 on the first and second front charge transport layers, forming the first back charge transport layer 512-1 and forming the second back charge transport layer 512-2 on the active layer with a gap between the first and second back charge transport layers, and forming the top common back electrode 514 over the first and second back charge transport layers. The first front charge transport layer collects holes, the second front charge transport layer collects electrons, the first back charge transport layer collects electrons, and the second back charge transport layer collects holes so that the first solar cell has a pin configuration and the second solar cell has a nip configuration.

In one application, there is a via or gap between the first front charge transport layer and the second front charge transport layer. The substrate has a portion that extends beyond the first and second solar cells, and a portion of the top common back electrode extends directly above and touches the portion of the substrate. In this application or another one, there is no region where the first front and back charge transport layers, or the second front and back charge transport layers are in direct contact with each other. Also, in this or another application, there is no direct contact between the top common back electrode and the active layer.

The disclosed embodiments provide a top-to-top connected thin film solar module and method of manufacturing the same. It should be understood that this description is not intended to limit the invention. On the contrary, the embodiments are intended to cover alternatives, modifications and equivalents, which are included in the spirit and scope of the invention as defined by the appended claims. Further, in the detailed description of the embodiments, numerous specific details are set forth in order to provide a comprehensive understanding of the claimed invention. However, one skilled in the art would understand that various embodiments may be practiced without such specific details.

Although the features and elements of the present embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A solar module for transforming solar energy into electrical energy, the solar module comprising:
- a substrate; and
- a pair of solar cells formed on the substrate next to each other and electrically connected in series to each other through a top common back electrode, the pair of solar cells sharing a continuous active layer extending across each cell,
- wherein a first solar cell of the pair has a pin configuration, and a second solar cell of the pair has a nip configuration,
- wherein the pin configuration and the nip configuration are defined by locations of hole and electron transport layers, of opposite polarities, relative to the top common back electrode and the active layer, such that the transport layers are in a reverse order between the first and second solar cells,
- wherein the first solar cell and the second solar cell include a first front electrode and a second front electrode, respectively, located on the substrate,
- wherein a via is defined between the first and second front electrodes, and
- wherein the via is filled by the continuous active layer.

2. The solar module of claim 1, wherein the first solar cell includes:
- the first front electrode located on the substrate;
- a first front charge transport layer located on the first front electrode;
- the active layer located on the first front charge transport layer;
- a first back charge transport layer located on the active layer; and
- the top common back electrode,
- wherein the first front charge transport layer collects holes and the first back charge transport layer collects electrons according to the pin configuration.

3. The solar module of claim 2, wherein the second solar cell includes:
- the second front electrode located on the substrate;
- a second front charge transport layer located on the second front electrode;
- the active layer located on the second front charge transport layer;
- a second back charge transport layer located on the active layer; and
- the top common back electrode,
- wherein the second front charge transport layer collects electrons and the second back charge transport layer collects holes according to the nip configuration.

4. The solar module of claim 3, wherein there is a via between the first front charge transport layer and the second front charge transport layer.

5. The solar module of claim 3, wherein the substrate has a portion that extends beyond the first and second solar cells, and a portion of the top common back electrode extends directly above and touches the portion of the substrate.

6. The solar module of claim 3, wherein there is no region where the first front and back charge transport layers, or the second front and back charge transport layers are in direct contact with each other.

7. The solar module of claim 1, wherein there is no direct contact between the top common back electrode and an active layer.

8. The solar module of claim 7, wherein the active material is perovskite.

9. The solar module of claim 1, further comprising:
another pair of solar cells formed on the substrate, next to each other, and electrically connected in series to each other through another top common back electrode,
wherein a first solar cell of the another pair has the pin configuration, and a second solar cell of the another pair has the nip configuration.

10. The solar module of claim 9, wherein the second solar cell of the pair and the first solar cell of the another pair share a same front electrode.

11. A solar module for transforming solar energy into electrical energy, the solar module comprising:
a substrate; and
plural pairs of solar cells formed on the substrate next to each other, each pair of solar cells being electrically connected in series to each other through a top common back electrode, and solar cells from two adjacent pairs being electrically connected in series to each other through a bottom common front electrode, the plural pairs of solar cells sharing a continuous active layer extending across each cell,
wherein each pair of solar cells has one solar cell with a pin configuration and another cell with a nip configuration,
wherein the pin configuration and the nip configuration are defined by locations of hole and electron transport layers, of opposite polarities, relative to the top common back electrode and the active layer, such that the transport layers are in a reverse order between solar cells of each pair,
wherein each pair of solar cells includes a first front electrode and a second front electrode, respectively, located on the substrate;
wherein a via is defined between the first and second front electrodes of each pair, and
wherein the via is filled by the continuous active layer.

12. A method for making a solar module for transforming solar energy into electrical energy, the method comprising:
simultaneously forming a first solar cell and a second solar cell on a substrate,
next to each other so that each cell share a continuous active layer; and
electrically connecting in series the first solar cell to the second solar cell through a top common back electrode,
wherein the first solar cell has a pin configuration, and the second solar cell has a nip configuration,
wherein the pin configuration and the nip configuration are defined by locations of hole and electron transport layers, of opposite polarities, relative to the top common back electrode and the active layer, such that the transport layers are in a reverse order between the first and second solar cells, and
wherein forming the first solar cell and the second solar cell includes:
forming a first front electrode and a second front electrode, respectively, on the substrate,
defining a via between the first and second front electrodes, and
forming the continuous active layer such that the via is filled by the continuous active layer.

13. The method of claim 12, wherein forming the first solar cell includes:
forming the first front electrode on the substrate;
forming a first front charge transport layer on the first front electrode;
forming the active layer on the first front charge transport layer;
forming a first back charge transport layer on the active layer; and
forming the top common back electrode,
wherein the first front charge transport layer collects holes and the first back charge transport layer collects electrons according to the pin configuration.

14. The method of claim 13, wherein forming the second solar cell includes:
forming the second front electrode on the substrate;
forming a second front charge transport layer on the second front electrode;
forming the active layer on the second front charge transport layer;
forming a second back charge transport layer on the active layer; and
forming the top common back electrode over the first and second back charge transport layers,
wherein the second front charge transport layer collects electrons and the second back charge transport layer collects holes according to the nip configuration.

15. The method of claim 14, wherein the substrate has a portion that extends beyond the first and second solar cells, and a portion of the top common back electrode extends directly above and touches the portion of the substrate.

16. The method of claim 14, wherein there is no region where the first front and back charge transport layers, or the second front and back charge transport layers are in direct contact with each other.

17. The method of claim 12, wherein there is no direct contact between the top common back electrode and the active layer.

* * * * *